United States Patent [19]

Kasai et al.

[11] 4,241,321
[45] Dec. 23, 1980

[54] ELECTROMECHANICAL FILTER

[75] Inventors: Yoshihiko Kasai, Yokahama; Takashi Gounji, Kawasaki; Yoshio Katsube, Yokohama, all of Japan

[73] Assignee: Fujitsu Limited, Japan

[21] Appl. No.: 12,390

[22] Filed: Feb. 15, 1979

[30] Foreign Application Priority Data

Feb. 15, 1978 [JP] Japan ................... 53/016259

[51] Int. Cl.³ .................. H03H 9/24; H03H 9/50
[52] U.S. Cl. ........................ 333/198; 333/186; 333/197
[58] Field of Search ................ 333/197–199, 333/186

[56] References Cited

U.S. PATENT DOCUMENTS

| | | | |
|---|---|---|---|
| 2,955,267 | 10/1960 | Mason | 333/198 |
| 2,969,511 | 1/1961 | Börner | 333/198 |
| 2,994,047 | 7/1961 | Börner | 333/198 |
| 3,013,228 | 12/1961 | Kettel et al. | 333/198 |
| 3,086,182 | 4/1963 | Börner | 333/198 |
| 3,445,792 | 5/1969 | Börner et al. | 333/198 |

FOREIGN PATENT DOCUMENTS

| | | |
|---|---|---|
| 1257993 | 1/1968 | Fed. Rep. of Germany . |
| 2037209 | 2/1972 | Fed. Rep. of Germany .......... 333/198 |
| 44-17402 | 7/1969 | Japan . |
| 52-16946 | 2/1977 | Japan . |
| 52-56841 | 5/1977 | Japan . |

OTHER PUBLICATIONS

Johnson et al.–"Mechanical Filters–A Review of Progress" IEEE Transactions on Sonics and Ultrasonics, vol. SU-18, No. 3, Jul. 1971; pp. 155–170.

Borner et al.–"Mechanische Filter für die Nachrichtentechnik," Telefunken–Zeitung, Jg. 31 (Jun. 1958) Heft 12; pp. 105–114.

*Primary Examiner*—Marvin L. Nussbaum
*Attorney, Agent, or Firm*—Staas & Halsey

[57] ABSTRACT

An electromechanical filter having minimum attenuation deviation in the pass band frequency range. The filter includes a plurality of mechanical resonators arranged substantially parallel to each other in one plane and mechanical couplers of longitudinal resonance characteristics which are disposed substantially transverse to the plurality of resonators for coupling the resonators together. The couplers have lengths which are between the first and second, and second and third oscillation modes of the longitudinal resonance characteristics. By virtue of the above structure, the couplers can be formed in a single mechanical coupling wire.

11 Claims, 5 Drawing Figures

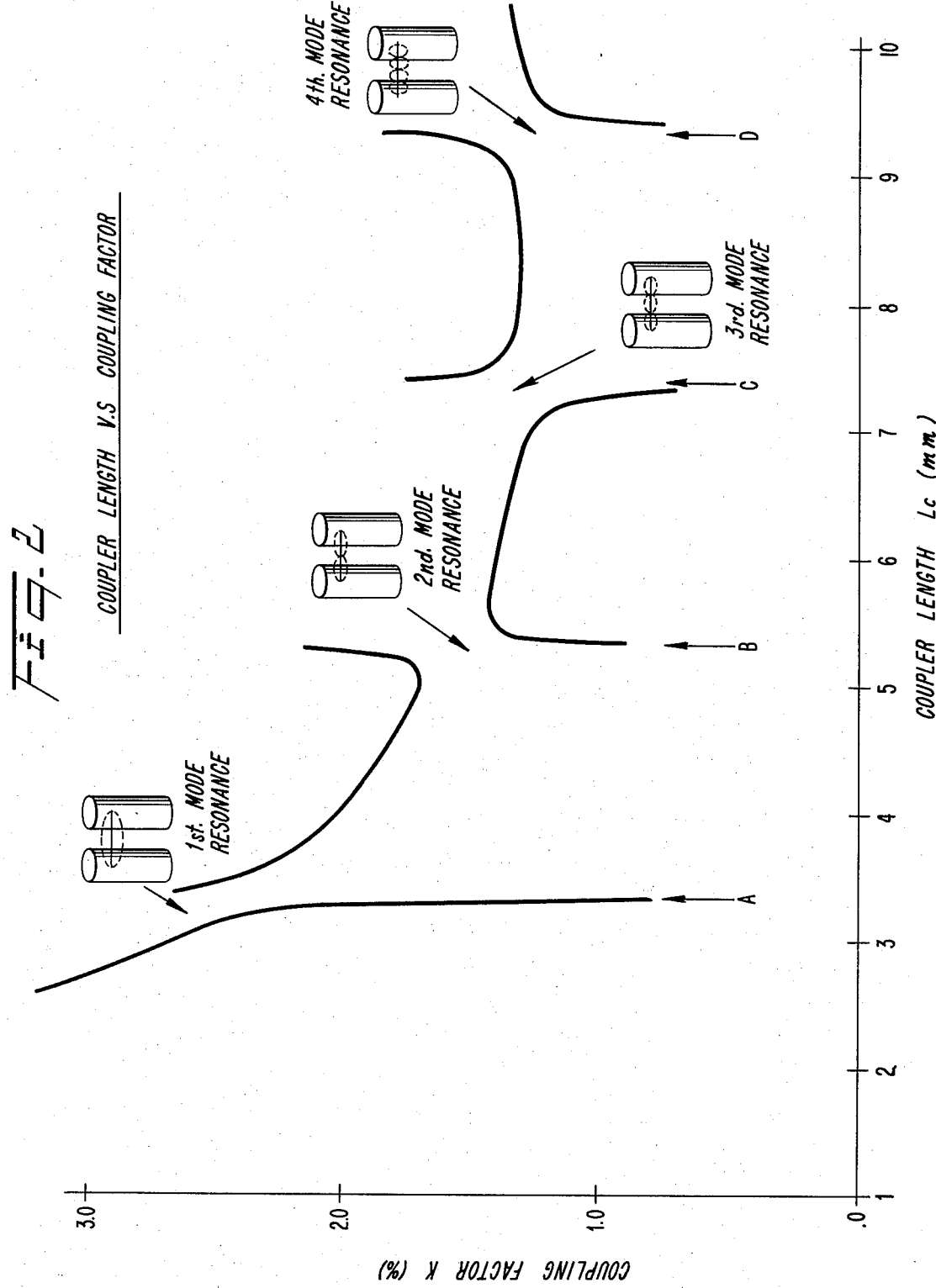

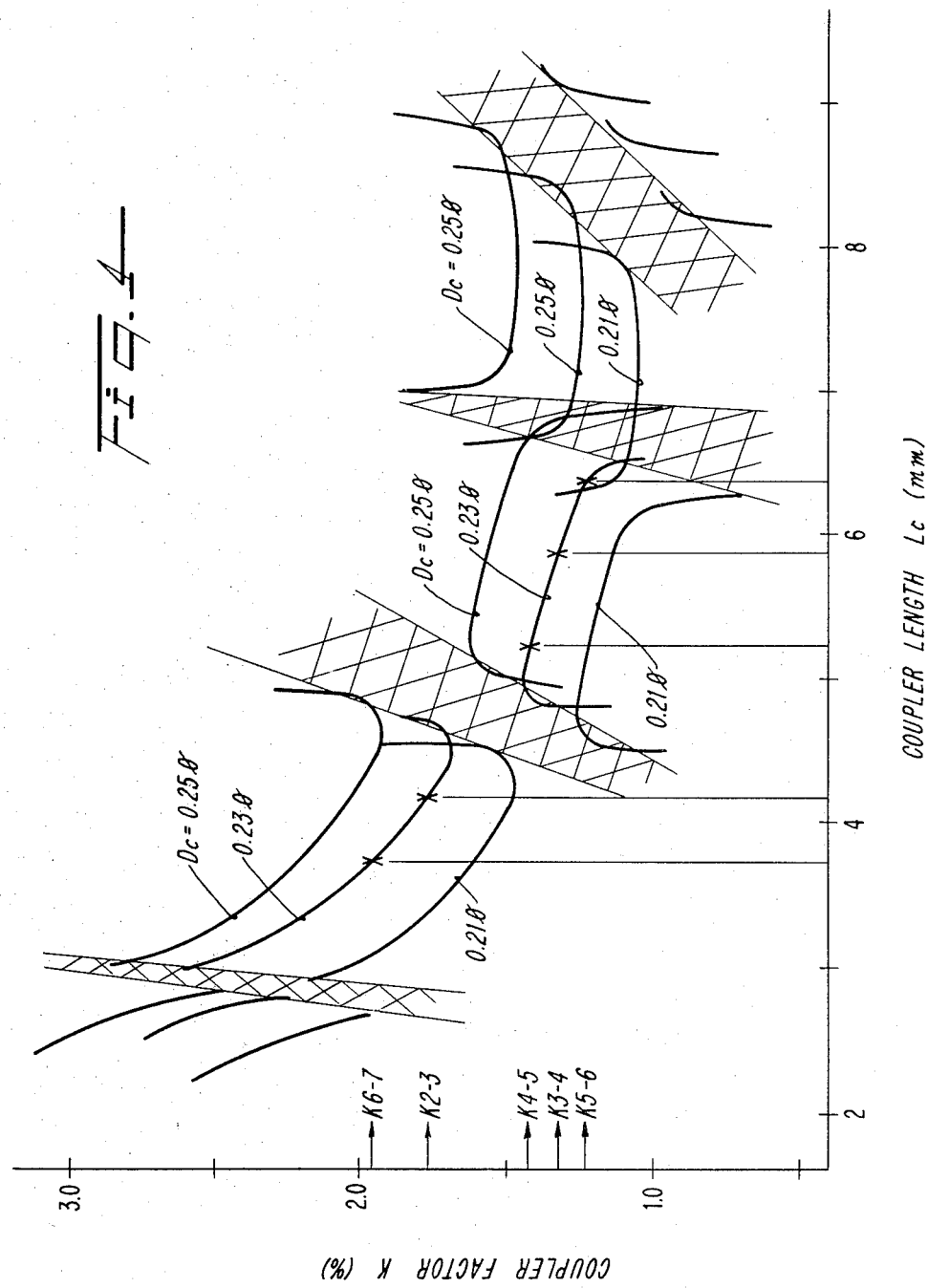

ELECTROMECHANICAL FILTER

BACKGROUND OF THE INVENTION

1. Field of the Invention

This invention relates to an electromechanical filter and, more particularly, to a high performance mechanical frequency filter having low attenuation deviation in the pass band frequency range.

Mechanical filters comprising mechanical resonant elements which are mechanically connected together by coupling elements are now commonly used to produce certain filter frequency characteristics. Such mechanical filters are advantageous in commercial applications because of their small size and structure.

Recently, mechanical filters have been used as channel filters for carrier transmission and channel translating equipment. In this equipment, there is need for high performance mechanical filters having minimum attenuation deviation in the pass band frequency range. To achieve these stringent filter characteristics, the dimensional requirements of the mechanical resonator and coupling elements of the filter likewise become critical as will be described in greater detail hereinafter. In formulating a high performance mechanical channel filter, furthermore, the overall structure must be held to a minimum size.

All high performance mechanical filters, of course, must be highly reliable and manufactured in the most cost-effective way while ensuring the necessary filter characteristics. Two key factors in reducing cost is to provide a mechanical filter that is simple in structure and that has filter elements which are standardized in dimension and which do not require close dimensional tolerances.

2. Description of the Prior Art

To generally explain the characteristics of electromechanical filters, reference is made to FIG. 1(A) illustrating known elements of one type of mechanical filter and FIG. 1(B) showing an electrical circuit equivalent to the mechanical filter of FIG. 1(A).

As best seen in FIG. 1(A), a pair of resonators 1 and 3 are mechanically connected together by a coupler 2. The diameters of the resonators 1 and 3 are designated Dr, the lengths of the resonators 1 and 3 as L, the diameter of the coupler 2 as Dc, the length of the coupler 2 as Lc, the distance between the resonators 1 and 3 as Ls, and the distance from the edge of the torsional resonators to the coupler as x. In the filter illustrated, resonators 1 and 3 are considered to operate with torsional resonance characteristics while coupler 2 operates with a longitudinal resonance characteristic.

A mechanical filter, such as illustrated in FIG. 1(A), can be translated into an equivalent electrical circuit, and vice versa. The equivalent electrical circuit of the filter of FIG. 1(A) is depicted in FIG. 1(B). A series resonant circuit section 1' comprising elements $L_2$ and $C_2$ and a series resonant circuit section 3' comprising elements $L_1$ and $C_1$ correspond respectively to the mechanical resonators 1 and 3. A circuit section 2' with capacitor element $C_c$ corresponds to the mechanical coupler 2. Since the mechanical filter has inputs whereby an input electric signal is transformed into a mechanical vibration and outputs whereby a mechanical vibration is converted into an output electrical signal, the electrical circuit of FIG. 1(B) has corresponding input terminals 4 and 4' and output terminals 5 and 5'.

To achieve certain filter characteristics in commercial applications of mechanical filters, a series of mechanical resonators and couplers, such as shown in FIG. 1(A), are cascaded in succession. An equivalent electrical circuit is effected, accordingly, in the form of a chain circuit.

In the mechanical filters having a series of mechanical resonators, particularly those of pole-type configuration, there is frequently employed additional lines or "bridging couplers" in order to improve group delay time characteristics of the filter. Bridging couplers mechanically couple together non-successive resonators of a frequency filter, i.e., coupling lines which mechanically couple resonators that do not immediately follow each other. The equivalent electrical circuit for such a filter would include a capacitor, corresponding to the bridging coupler, connected in parallel with the equivalent electrical circuit in the chain circuit. Illustrative of an electromechanical filter having bridging couplers is shown, for example, in German patent Auslegeschrift No. 1,257,993.

To obtain desired filter characteristics by a mechanical filter, it is necessary to first develop the equivalent electrical circuit. After determining the values of the circuit components, such as the coils $L_1$ and $L_2$ and capacitors $C_1$ and $C_2$ in the series sections 3' and 1' and the capacitor $C_c$ in the parallel section 2' of the FIG. 1(B) circuit, the electrical values must be converted to corresponding mechanical resonators and coupling elements. Significantly, any variation in the capacitor $C_c$ of the parallel arm of FIG. 1(B), and its equivalent of the mechanical coupler 2, has a major influence on the desired filter characteristics. A highly accurate correspondence, therefore, must be made between these two components. To achieve this correspondence, it is neccesary to match what is commonly referred to in the art as the coupling factor or coefficient obtained from the electrical circuit with the mechanical configuration.

The coupling factor of a coupler, hereinafter designated as k, is best explained below with further reference to FIG. 1(B). If two resonant frequencies obtained at the terminals 4 and 4' when the terminals 5 and 5' being short-circuited $fr_1$ and $fr_2$ and $fr_1 < fr_2$, the coupling factor k is expressed as follows:

$$k = (fr_2 - fr_1)/fr_1$$

Wherein $$fr_1 = \frac{1}{2x} \sqrt{\frac{B - \sqrt{B^2 - 4AC}}{2A}}$$

$$fr_2 = \frac{1}{2x} \sqrt{\frac{B + \sqrt{B^2 - 4AC}}{2A}}$$

$$A = L_1 L_2$$

$$B = L_1 (\frac{1}{C_2} + \frac{1}{C_c}) + L_2 (\frac{1}{C_1} + \frac{1}{C_c})$$

$$C = \frac{1}{C_1 C_2} + \frac{1}{C_2 C_c} + \frac{1}{C_c C_1}.$$

In determining the capacitor in parallel section 2' of the electrical circuit of FIG. 1(B), the coupling factor k is a constant.

Difficulties are presented in selecting the length of a coupler to achieve the desired coupling factor k. Abnormal points occur in the coupling factor due to different mode oscillation or a bending mode resonance generated in the coupler, even though the coupler described previously has a longitudinal resonance characteristic so as to transfer the torsional resonance of a resonator or other resonators coupled. The abnormal points of the coupling factor can be determined depending upon the diameter Dc and length Lc of a coupler.

If, for the mechanical filter shown in FIG. 1(A), the diameters Dr of the resonators 1 and 3 are 3.0 mm$\phi$, the diameter Dc of the coupler 2 is 0.28 mm$\phi$, and the coupling position x is 2.50 mm, the relationship of the coupling length Lc to the coupling factor k is shown in FIG. 2. The abscissa of the FIG. 2 graph indicates length Lc (mm) of the coupler, while the ordinate indicates the coupling factor k (%). As can be seen in FIG. 2, the abnormal points of the coupling factor k are generated at designated points A, B, C, and D. Point A is at approximately the coupler length Lc of 3.3 (mm), point B at 5.3 (mm), point C at 7.3 (mm), and point D at 9.3 (mm). These abnormal points A, B, C, and D respectively represent different oscillation modes of the bending mode resonance characteristic of the coupler. For example, at point A, there is a first oscillation mode for the coupler, at point B a second oscillation mode for the coupler, at point C a third oscillation mode for the coupler, and at point D a fourth oscillation mode for the coupler. These modes are schematically illustrated in FIG. 2.

For use as a channel filter in channel translating equipment, a pole-type filter is recommended with the minimum possible number of components due to the requirement of group delay time characteristics for the pass band frequency range. In providing such a pole-type mechanical filter, the coupling factors for the couplers which mechanically connect the resonators become considerably different. Accordingly, various steps are necessary to prevent occurrence of bending mode oscillation of each coupler between resonators and avoid abnormal points in obtaining required coupling factors. To ensure the miniaturization of the channel filter, the coupler length is selected to be less than the second oscillation mode of the bending mode resonance characteristic of the coupler.

When using a cylindrical torsional resonator as shown in FIG. 1(A), the coupler length Lc is expressed approximately as:

Lc=Dr+Ls.

As can be seen from this equation and from FIG. 1(A), a coupler length Lc longer than Dr is required. The range of coupler lengths from which to select each of the required couplers is narrow when the coupler length is below the second oscillation mode of the bending mode resonance characteristic. Due to this limitation, it becomes difficult to obtain all of the desired coupling factors by use of a series of couplers betweens resonators which are formed in a single coupling wire. Various efforts have been made to achieve series coupling by a single coupling wire, but they do not prove completely satisfactory. For example, it is known to vary the diameters of the couplers as described in Japanese unexamined publication No. 52-56841, to change the connecting positions as described in Japanese examined publication No. 44-17402, and to change the diameters of the torsional resonators as described in Japanese unexamined publication No. 52-16946.

When, however, diameters of the couplers or the connecting positions are changed, use of different types of couplers become necessary and the number of coupler connecting points between the resonators increases. Moreover, when one or more of the torsional resonators are changed diametrically, use of different types of resonators also becomes necessary and the ability to connect couplers to the resonators, such as by spot welding, more difficult. In summary, material and manufacturing control become unduly complicated due to lack of standardization in the filter components. Automated manufacturing and mass production of such filters is difficult and expensive.

Further difficulties are encountered in manufacturing these filters because each coupler length is selected to be under the second oscillation mode of the bending mode resonance characteristic of the coupler. As best seen in FIG. 2, there is a large variation in the coupling factor k in relationship to a change in the coupler length Lc when the coupler length Lc is small. Consequently, tolerance of the coupler length must be held within close dimensions in manufacturing to obtain a desired coupling factor. To meet the stringent requirements in pass band frequency characteristics for a channel filter, error in the coupling factors should be held to within one percent (1%). This compounds the problem. In order to maintain an error in the coupling factor of within one percent while using a coupler length shorter than the second oscillation mode of the bending mode resonance characteristic, tolerance in the coupler length is extremely tight.

For the type of mechanical filter illustrated in FIG. 1(A), when the coupler length Lc is below the first oscillation mode as shown in FIG. 2, tolerance in the coupler length must be held to approximately 30 $\mu$m. When the length of the coupler is between the first and second oscillation modes, the tolerance in the coupler length is approximately 60 $\mu$m. For a coupler length between the second and third oscillation modes, the tolerance is approximately 120 $\mu$m.

As can be seen from the foregoing remarks, electromechanical filters with minimum attenuation deviation in the pass band frequency range and which are simple in structure, reliable, and easily manufactured, have yet to be satisfactorily achieved.

SUMMARY OF THE INVENTION

Accordingly, it is a primary object of this invention to eliminate the above-described problems in electromechanical filters, particularly channel filters used in channel translating and carrier transmission equipment.

Another object of this invention is to obtain low attenuation deviation in the pass band frequency range of electromechanical filters.

Yet another object of this invention is to provide a simplified structure for electromechanical filters.

Another object of this invention is to provide improved manufacture for electromechanical filters.

Still another object of this invention is to obtain high performance and reliability in electromechanical filters.

Additional objects and advantages of the invention will be set forth in part in the description which follows, and in part will be obvious from the description, or may be learned by practice of the invention. The objects and advantages of the invention may be realised and obtained by means of the instrumentalities and combinations particularly pointed out in the appended claims.

To achieve the foregoing objects and in accordance with the purpose of the invention, as embodied and broadly described herein, the electromechanical filter comprises (1) first and second transducers for transforming respectively an input electrical signal into a mechanical vibration and a mechanical vibration into an output electrical signal, (2) a plurality of mechanical resonators arranged substantially parallel to each other in one plane, (3) first and second mechanical couplers for coupling respectively the first transducer with one of the plurality of resonators and the second transducer with another of the plurality of resonators, and (4) a third mechanical coupler disposed substantially transverse to the plurality of resonators for coupling at least three of the mechanical resonators, the third coupler having a longitudinal mode resonance characteristic wherein a first portion of the third coupler's length is between first and second oscillation modes of a bending mode resonance characteristic and a second portion of the third coupler's length is between second and third oscillation modes of a bending mode resonance characteristic.

In a preferred embodiment of the electromechanical filter, the plurality of mechanical resonators have torsional resonance characteristics.

In another preferred embodiment of the electromechanical filter, the plurality of mechanical resonators are of a substantially uniform cylindrical solid configuration and wherein the first, second and third couplers are welded at one point on the circumferencial surface of the corresponding connected resonators.

In yet another embodiment of the electromechanical filter, the third couplers are formed as a single coupling wire of substantially uniform dimension.

BRIEF DESCRIPTION OF THE DRAWINGS

The accompanying drawings, which are incorporated in and constitute a part of the specification, illustrate embodiments of the invention and, together with a description, serve to explain the principles of the invention.

FIG. 2 is a graph showing the relationship between coupler length Lc and coupling factor k for a coupler of a longitudinal resonance characteristic;

DETAILED DESCRIPTION OF THE PREFERRED EMBODIMENTS

Figure 1A:
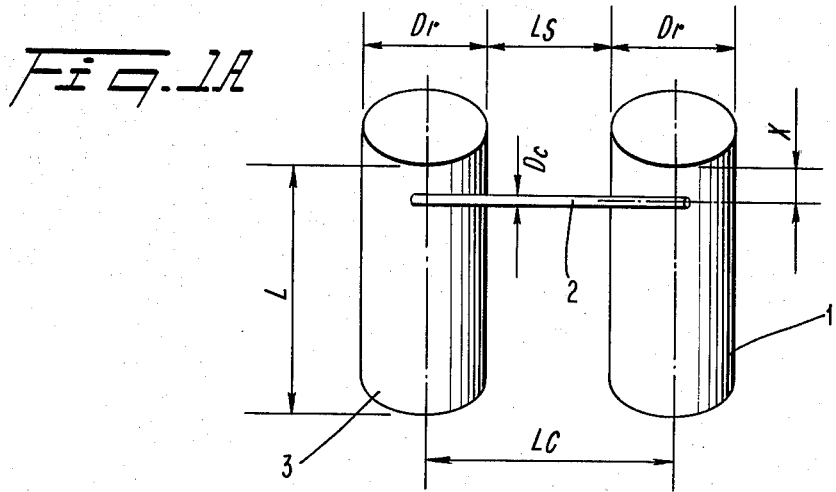
FIG. 1(A) is an illustrative diagram of a pair of resonators and a coupler employed in one type of mechanical filter.
Figure 1B:
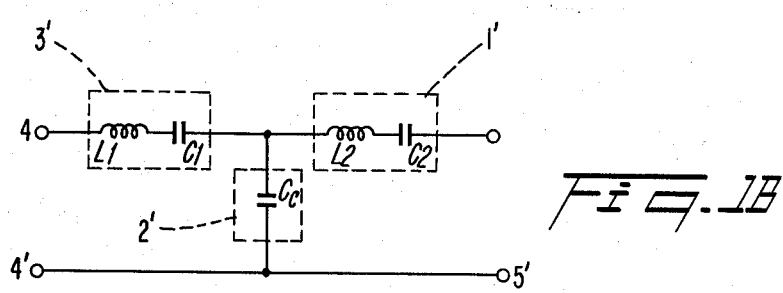
FIG. 1(B) is a circuit diagram which is an electrical equivalent of the mechanical filter shown in FIG. 1(A)
Figure 3:
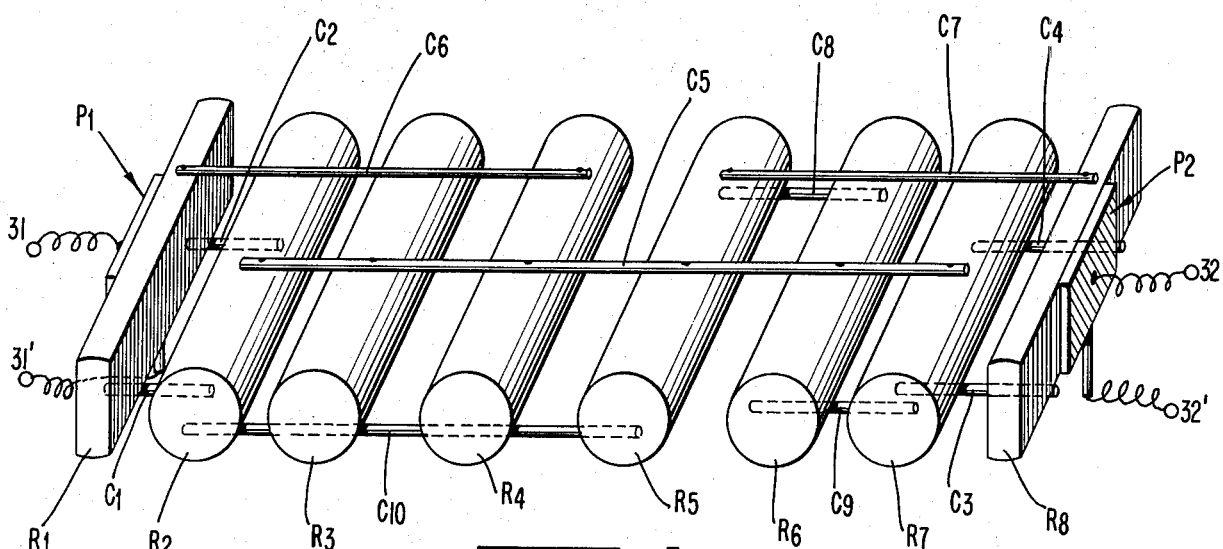
FIG. 3 is a schematic perspective view of one embodiment of the electromechanical filter according to the present invention; and, FIG. 4 is a graph showing the relationship between coupler length Lc and coupling factor k when there are different diameters for a coupler of a longitudinal resonance characteristic.

Reference will now be made in detail to the present preferred embodiments of the invention, an example of which is illustrated in FIG. 3.

In accordance with the invention, the electromechanical filter includes first and second transducers for transforming respectively an input electrical signal into a mechanical vibration and a mechanical vibration into an output electrical signal.

As here embodied, the first transducer comprises piezoelectric ceramic plate P1 connected to input terminals 31 and 31' and a bending-mode conversion resonator R1 adjacent to and connected with the piezoelectric ceramic plate P1. In similar fashion, the second transducer comprises a piezoelectric ceramic plate P2 connected to output terminals 32 and 32' and a bend-mode conversion resonator R8 adjacent to and connected with the piezoelectric plate P2. As is known in the art, a piezoelectric plate has the ability to transform an electric charge into a mechanical vibration, and vice versa. This property is known as the piezoelectric effect. It may be seen, however, that the first and second transducers of this electromechanical filter can comprise a different structure, such as one having magnetostrictive elements, to transform electrical and mechanical signals.

The electromechanical filter of this invention further comprises a plurality of mechanical resonators arranged substantially parallel to each other in one plane. As herein embodied, and as best seen in FIG. 3, the plurality of mechanical resonators include resonators R2, R3, R4, R5, R6, and R7 which have torsional characteristics and which are disposed in a series. The resonators are preferably of a substantially uniform cylindrical and solid construction.

In accordance with the invention, the electromechanical filter further comprises a plurality of mechanical couplers for connecting the mechanical resonators. As herein embodied, first and second mechanical couplers couple respectively the first transducer with one of the plurality of resonators and the second transducer with another of the plurality of resonators. Preferably, the first mechanical coupler comprises couplers C1 and C2. Couplers C1 and C2 couple the bending-mode conversion resonator R1 of the first transducer to the first torsional resonator R2 in the series of resonators to transmit a mechanical vibration thereto. The second mechanical coupler comprises couplers C3 and C4. Couplers C3 and C4 couple the last torsional resonator R7 in the series of resonators to the bending-mode conversion resonator R8 of the second transducer to transmit a mechanical vibration thereto.

In accordance with the invention, the couplers of the filter include a third mechanical coupler disposed substantially transverse to the plurality of resonators for coupling at least three of the mechanical resonators. This third coupler has a longitudinal resonance characteristic so as to transfer the torsional resonance of a resonator to other resonators coupled. First portions of the third coupler's length are between first and second oscillation modes of a bending mode resonance, second portions of the third coupler's length are between second and third oscillation modes of the bending mode resonance, and the first and second modes of the bending mode resonance are present according to the length of couplers. The first and second portions of the third coupler's lengths are formed between mutually connected resonators.

As herein embodied, the third mechanical coupler comprises coupler C10 formed in a single wire to mechanically couple the torsional resonators R2, R3, R4, and R5. In view of the configuration of the mechanical resonators described previously, the third coupler C10 is formed as a single wire of substantially uniform dimension and the first, second and third couplers are welded at one point on the circumferential surface of the corresponding connected resonators.

In the embodiment of the filter shown in FIG. 3, a mechanical coupler C8 couples the torsional resonator R5 with the torsional resonator R6 and a mechanical coupler C9 couples the torsional resonator R6 with the torsional resonator R7. As will be explained in greater detail hereinafter, in yet another embodiment of the invention, resonator R7 is connected with resonator R6 and resonator R6 with R5 by coupling lengths which are formed as an extension of the single coupler wire C10.

In addition to the above mechanical couplers, a wire C5 is preferably provided in the filter of FIG. 3 to serve as support means so that the resonators together form a mechanically stable structure. Preferably, the support wire C5 is connected to each of the torsional resonators R2 through R7, such as by welding at one point on the circumferential surface of the resonators, or by other suitable connecting means. The elements C6 and C7 constitute "bridging couplers" which are used in a manner disclosed in the previously referenced German patent Auslegeschrift No. 1,257,993. The bridging coupler C6 has its ends connected, such as by welding, to transducer resonator R1 and torsional resonator R4, while bridging coupler C7 has its ends connected, such as by welding, to torsional resonator R5 and transducer resonator R8.

In operating the electromechanical filter described above and shown in FIG. 3, an electrical signal at the input terminals 31 and 31' is applied to the piezoelectric ceramic plate P1. Due to the piezoelectric effect of plate P1, a bending vibration is induced to the adjoining bending-mode conversion resonator R1. The induced bending vibration in resonator R1 is in turn transmitted to the torsional resonator R2 via the couplers C1 and C2. The resonator R2 generates torsional vibration which is sequentially transmitted to the last resonator R7 of the series by couplers C10, C8, and C9. The torsional vibration induced in resonator R7 is then transmitted to the bending-mode conversion resonator R8 of the second transducer by means of couplers C3 and C4. The mechanical vibration formed in the resonator R8 is converted into an output electrical signal at terminals 32 and 32' by the adjoining piezoelectric ceramic plate P2 of the second transducer.

As is now further described, the range from which to select the diameters and lengths for coupling is increased if the coupling length between the resonators R2 and R3 is formed at a length between the first and second oscillation modes of the bending mode resonance characteristic of the coupler and the coupler lengths between the resonators R3 and R4, and R4 and R5 are formed at lengths between the second and third oscillation modes of the bending mode resonance characteristic of the coupler. Because of this, coupling of resonators R2, R3, R4, and R5 can be achieved by the single coupling wire C10.

As shown in the graph of FIG. 2, it is physically impossible to select a coupler length Lc in a range leftward from point A (i.e., about 3.3 (mm) or below) because the resonator diameter in the illustrated example is $3.0\phi$ (mm) and the coupler length Lc must be equal to or greater than the resonator diameter Dr. Even if the dimensions of the resonator were changed so the coupler length could be selected within the range leftward from the point A, a highly precise coupling factor would still be difficult to obtain. Large variations would occur in the coupling factor when even the slightest change was made in the coupler length. This is unacceptable. If a length for the couplers were to be selected between the points C and D (i.e., between the third and fourth oscillation modes of the bending mode resonance characteristic of the coupler), this would cause the filter structure to increase to an unacceptable size. Therefore, to achieve a mechanical filter having the minimum size while maintaining high filter performance, coupler lengths are selected between the points A and C, or the first and third oscillation modes of the bending mode resonance characteristic of the coupler.

In addition to selecting coupler lengths in the range described above, a coupling diameter must be selected that will provide the necessary coupling factors between the mutually connected resonators. FIG. 4 shows the relationship between coupler lengths Lc and the coupling factors k for several coupler diameters Dc when the connecting point x of the coupler and resonator is about 1.6 mm, the torsional resonator length L is 11.1 mm, the torsional wave propagation velocity $V_T$ is 2850 m/s, and the longitudinal wave propagation velocity $V_L$ of the coupler is 4700 m/s. The abscissa of the FIG. 4 graph indicates coupler length Lc (mm), while the ordinate indicates coupling factor k (%). The crosshatched areas represent the ranges where the oscillation modes of the coupler also occur near the frequency pass band of the electromechanical filter.

As will be seen from FIG. 4, if a coupler is selected with a length in the first oscillation mode of the bending mode characteristic that is the minimum possible coupler length which can be utilized with the resonators, i.e., Lc=Dr, the selection range for the various coupler lengths can be widened and the desired coupling factors between the mechanical resonators can be obtained with a single coupling wire without entering the oscillation modes occurring at or near the frequency band width of the filter.

For an electromechanical filter having a center frequency of 129.85 kHz, a pass band Chebyshev, a pass band width of 3.3 kHz with four attenuation poles, and ten structural elements of eight resonators and two input-output matching transformers, the desired coupling factors between the torsional resonators are shown by the arrow marks on the ordinate of the FIG. 4 graph. The coupling factors k2-3, k3-4, k4-5, k5-6, k6-7 correspond respectively to couplings between resonators R2 and R3, R3 and R4, R4 and R5, R5 and R6, and R6 and R7. If a diameter of about $0.23\phi$ (mm) is used for the couplers, the coupler lengths between the resonators R2 and R3, R3 and R4, and R4 and R5 would respectively be 4.2 (mm), 5.85 (mm), and 5.25 (mm). It can thus be understood that the coupler length 4.2 (mm) would fall between the first and second oscillation mode resonances of the bending mode resonance characteristic, and the coupler lengths 5.85 and 5.25 (mm) would be located between the second and third oscillation modes of the bending mode resonance characteristic. Accordingly, couplers for the resonators R2, R3, R4, and R5 can be suitably formed in a single coupling wire C10 with the diameter of $0.23\phi$ without detracting from the filter requirements.

From the FIG. 4 graphs it can be seen that other coupler diameters Dc, for example, $0.25\phi$ (mm) and $0.21\phi$ (mm), could be used in forming a single coupler C10 without allowing any of the coupler lengths to enter the first, second or third oscillation modes of the bending mode resonance characteristic of the coupler. Moreover, when a diameter Dc of about $0.23\phi$ is selected for the C10 coupler, the two couplers C8 and C9 in the embodiment of the FIG. 3 filter can be formed as an extension of the single coupler wire C10. To obtain the coupling factors k5-6 and k6-7, the lengths of coupler C8 and C9 would be respectively 6.4 (mm) and 3.7 (mm). These coupler lengths would fall between the first and second, and second and third oscillation modes of the bending mode resonance characteristic without entering the frequency band width of the filter.

In accordance with the invention, significant advantages can be achieved in an electromechanical filter by using coupler lengths selected between the first and second or second and third oscillation modes of the bending mode resonance characteristic of the coupler. Error variation in the desired coupling factor can be minimized, for example, should a variation in the coupling length occur. In this respect, less tolerance would be required in the coupling length without causing any deviation in the coupling factor. If the tolerance in the coupling length is maintained, error in the coupling factor can be reduced to about one-half to one-third that of the conventional coupler designs. In reducing error in the coupling factor as described above, significant improvements result in the filter characteristics, particularly reduced attenuation deviation in the pass band frequency of the filter. The ability to form couplers for connecting the resonators in a single coupling wire, furthermore, results in standardization of the filter components and simplifies the welding process during production.

In summary, manufacture, quality, and reliability of an electromechanical filter made in accordance with this invention is significantly improved as compared to the conventional filters. These improvements will give the filter new industrial applications, including those in channel translating and carrier transmission equipment.

It will be apparent to those skilled in the art that various modifications and variations could be made in the electromechanical filter of the invention without departing from the spirit or scope of the invention. For example, resonators, other than the torsional resonators described for the preferred embodiment, can be used in the electromechanical filter employing the present invention.

What is claimed is:

1. An electromechanical filter comprising:
   (a) first and second transducers for transforming respectively an input electrical signal into a mechanical vibration and a mechanical vibration into an output electrical signal;
   (b) a plurality of mechanical resonators arranged substantially parallel to each other in one plane;
   (c) first and second mechanical couplers for coupling respectively said first transducer with one of said plurality of resonators and said second transducer with another of said plurality of resonators; and,
   (d) a third mechanical coupler having a longitudinal resonance characteristic disposed substantially transverse to said plurality of resonators for coupling together in series at least three of said mechanical resonators, wherein a first portion of the third coupler's length formed between a first pair of connected resonators is between first and second oscillation modes of a bending mode resonance characteristic of the third coupler and a second portion of the third coupler's length formed between a second pair of connected resonators is between second and third oscillation modes of the bending mode resonance characteristic.

2. The electromechanical filter of claim 1, wherein said plurality of mechanical resonators have torsional resonance characteristics.

3. The electromechanical filter of claim 1, wherein each of said transducers is an electromechanical transducer comprising a piezoelectric plate and a bending-mode conversion resonator operatively connected to said plate.

4. The electromechanical filter of claim 1, wherein said first, second and third couplers are connected respectively to the corresponding resonators at a point on the outer surface of the respective resonator.

5. The electromechanical filter of claim 4, wherein said plurality of mechanical resonators are of substantially uniform, cylindrical, and solid construction and wherein the first, second, and third couplers are welded respectively to the corresponding connected resonators at a point on the circumferential surface of the respective resonator.

6. The electromechanical filter of claim 1, wherein said plurality of mechanical resonators are of a cylindrical configuration.

7. The electromechanical filter of claim 6, wherein said plurality of mechanical resonators are of a solid configuration.

8. The electromechanical filter of claim 1, wherein the first and second portions of the third coupler's length are formed between pairs of connected resonators.

9. The electromechanical filter of claim 8, wherein said third coupler obtains coupling factors between connected resonators for forming a filter pass band frequency range of low attenuation deviation.

10. The electromechanical filter of claim 9, wherein said third coupler is formed as a single coupling wire of substantially uniform dimension.

11. An electromechanical filter comprising:
   (a) first and second transducers transforming respectively an input electrical signal into a mechanical vibration and a mechanical vibration into an output electrical signal;
   (b) a plurality of mechanical resonators arranged substantially parallel to each other in one plane and wherein certain of said resonators have torsional mode resonance characteristics,
   (c) first and second mechanical couplers for coupling respectively said first transducer with one of said plurality of resonators and said second transducer with another of said plurality of resonators; and,
   (d) a single coupling wire having a longitudinal mode resonance characteristic disposed substantially transverse to said plurality of resonators and mechanically connected to each of said plurality of resonators having a torsional mode resonance characteristic, wherein first portions of the wire's length formed between first pairs of connected resonators are between first and second oscillation modes of a bending mode resonance characteristic of said coupling wire and second portions of the wire's length formed between second pairs of connected resonators are between second and third oscillation modes of the bending mode resonance characteristic, said bending mode resonance characteristic being dependent upon the coupling wire's length.

* * * * *